United States Patent [19]

Metz, Jr. et al.

[11] Patent Number: 4,648,175
[45] Date of Patent: Mar. 10, 1987

[54] USE OF SELECTIVELY DEPOSITED TUNGSTEN FOR CONTACT FORMATION AND SHUNTING METALLIZATION

[75] Inventors: Werner A. Metz, Jr.; Nicholas J. Szluk; Gayle W. Miller; Michael J. Drury; Paul A. Sullivan, all of Fort Collins, Colo.

[73] Assignee: NCR Corporation, Dayton, Ohio

[21] Appl. No.: 743,849

[22] Filed: Jun. 12, 1985

[51] Int. Cl.$^4$ .................................. H01L 21/225
[52] U.S. Cl. .................................. 29/589; 29/590; 29/591; 427/88; 148/191
[58] Field of Search ............... 29/589, 571, 590, 578, 29/591; 148/1.5, 191, 188, 187, DIG. 139; 427/88

[56] References Cited

U.S. PATENT DOCUMENTS

| | | | |
|---|---|---|---|
| 3,632,436 | 1/1972 | Denning | 117/212 |
| 3,699,646 | 10/1972 | Vadasz | 29/571 |
| 4,101,349 | 7/1978 | Roesner et al. | 148/175 |
| 4,128,439 | 12/1978 | Jambotkar | 148/1.5 |
| 4,152,823 | 5/1979 | Hall | 29/571 |
| 4,239,559 | 12/1980 | Ito | 148/188 |
| 4,249,968 | 2/1981 | Gardiner et al. | 148/174 |
| 4,265,935 | 5/1981 | Hall | 427/89 |
| 4,276,688 | 7/1981 | Hsu | 29/571 |
| 4,322,736 | 3/1982 | Sasaki et al. | 357/59 |
| 4,330,931 | 5/1982 | Liu | 29/571 |
| 4,333,099 | 6/1982 | Tanguay et al. | 357/67 |
| 4,356,622 | 11/1982 | Widmann | 29/571 |
| 4,374,700 | 2/1983 | Scott et al. | 156/656 |
| 4,441,247 | 4/1984 | Gargini et al. | 29/571 |
| 4,445,266 | 5/1984 | Mai et al. | 29/571 |
| 4,450,620 | 5/1984 | Fuls et al. | 29/571 |
| 4,503,601 | 3/1985 | Chiao | 29/571 |
| 4,517,225 | 5/1985 | Broadbent | 427/89 |
| 4,519,126 | 5/1985 | Hsu | 29/571 |
| 4,540,607 | 10/1985 | Tsao | 427/253 |
| 4,549,914 | 10/1985 | Oh | 148/187 |
| 4,562,640 | 1/1986 | Widmann et al. | 29/591 |
| 4,563,805 | 1/1986 | Scovell et al. | 29/571 |
| 4,584,207 | 4/1986 | Wilson | 427/124 |

OTHER PUBLICATIONS

Moriya, T. et al, "A Planar Metallization process...", IEDM 83, 25.3, pp. 550-553.
Warner et al, "Transistors-Fundamentals for the I-C. Engineer", John Wiley & Sons, 1983, p. 123.

Primary Examiner—Brian E. Hearn
Assistant Examiner—Tuan Quach
Attorney, Agent, or Firm—Wilbert Hawk, Jr.; Casimer K. Salys

[57] ABSTRACT

A process for using selectively deposited tungsten in the making of ohmic contacts and contact/interconnect metallization patterns. In one form the process is employed to interconnect fully formed field effect devices using contacts through the dielectric layer. A thin layer of intrinsic polysilicon or amorphous silicon is conformally deposited, patterned and covered by selectively deposited tungsten, An anneal operation then forms self-aligned contacts or shunts, between the tungsten layer and the source/drain type diffusions exposed during the contact cut, by updiffusion through the thin intrinsic silicon, or by conversion of the thin intrinsic silicon to tungsten. Alternatively, contacts and shunts can be formed using polysilicon layers without regard to impurity type by making contact cuts through the dielectric to expose substrate regions, patterning a deposited polysilicon layer to cover only parts of such exposed regions, forming the field effect device source/drain regions, and then selectively depositing tungsten on all exposed surfaces of silicon. The tungsten thereby bridges the polysilicon layer to the adjacent, exposed substrate region and shunts all surface adjacent p-n junctions, including the polysilicon-to-substrate contact junction.

10 Claims, 9 Drawing Figures

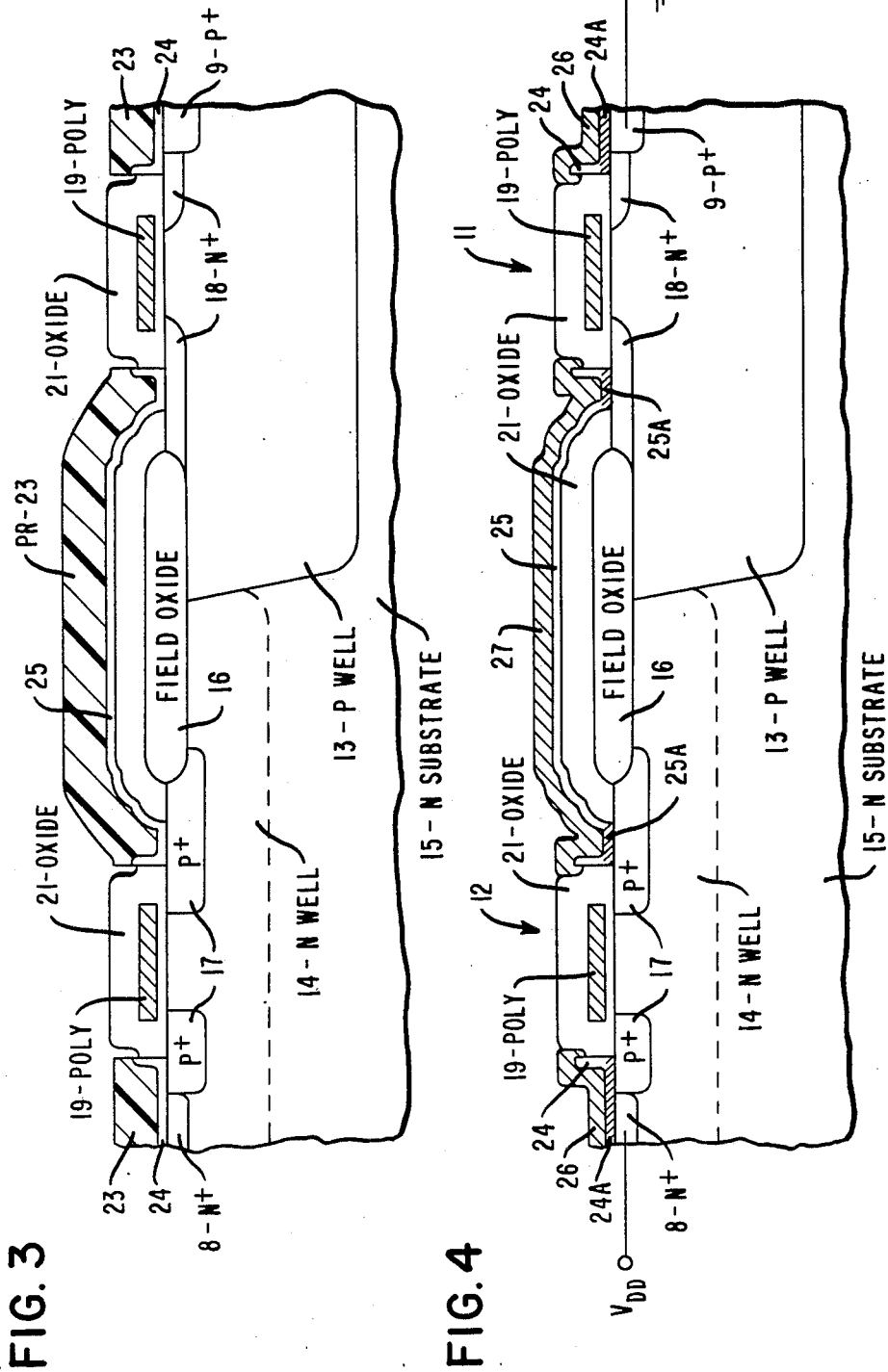

USE OF SELECTIVELY DEPOSITED TUNGSTEN FOR CONTACT FORMATION AND SHUNTING METALLIZATION

BACKGROUND OF THE INVENTION

The present invention relates to integrated circuit contact and interconnect technology and more particularly to the use of refractory metals in the formation of contacts and shunts. In particular, the present invention teaches an integrated fabrication process for forming contacts and shunts without regard to the impurity type of semiconductor regions being connected.

Metallization technology presently includes three broad areas: aluminum metallization processes; refractory metal processes, including those using tungsten; and composite layer processes, in which two or more separate conductors are deposited sequentially and then etched coextensively to the desired pattern. Each of these three approaches has advantages and disadvantages which are, typically, unique to the selected technology area.

Consider first the prevalent aluminum metallization technology. Aluminum, or aluminum alloyed with a small percentage of silicon and/or copper, has been the standard microelectronics interconnect metallization for a number of years. Accordingly, aluminum has the advantage of being very well characterized. However, as device component thicknesses and lateral dimensions are made increasingly smaller in progressing from LSI to VLSI technologies, and beyond, the disadvantages of aluminum—the difficulty in etching small geometry aluminum lines, electromigration susceptibility at small geometries, and aluminum spiking of shallow junctions—have become major impediments to its continued use. One technique for using aluminum to interconnect oppositely doped layers and regions is described in U.S. Pat. No. 4,322,736 to inventors Sasaki et al. Given the limited temperature capabilities of aluminum, this teaching corresponds in most respects to the contact forming techniques routinely used in the concluding stages of integrated circuit fabrication.

The limited temperature capabilities of aluminum, and the low adhesion capabilities of evaporated or sputtered refractory metal films, such as tungsten films, to silicon dioxide has in recent times lead to the development of techniques by which such films are selectively deposited. A representative investigation is described in Miller et al. "CVD Tungsten Interconnect and Contact Barrier Technology for VLSI", Solid State Technology, December 1982, pp. 85-90. Miller et al. discusses the need for new materials and deposition processes for VLSI technology in the areas of contact barriers, low resistance gates and alternative metallization techniques. Low resistance contact barriers of refractive metal are proposed to prevent aluminum spiking through shallow, scaled junctions. Exemplary barriers include the more common Ti-W over platinum silicide and Ti-W over palladium silicide, along with a proposed CVD tungsten barrier technique. The Miller et al., article considers silicide shunts and composite Ti-W over silicide contact barriers, and proposes the substitution of CVD tungsten for such materials in contact barriers and low resistance shunt applications, as well as for aluminum metallization. Similar techniques are described in Moriya et al., "A Planar Metallization Process - Its Application to Tri-Level Aluminum Interconnection," IEDM 1983, Paper 25.3, pp. 550-552, and in the paper entitled "Low Pressure Chemical Vapor Deposition of Metals and Their Application in VLSI Technology," presented by E.K. Broadbent at the Electrochemical Society Meeting in Washington, D.C. on Oct. 9-14, 1983.

These articles and presentations do not suggest using a patterned layer of very thin conformally deposited intrinsic polysilicon or amorphous silicon to define the selectively deposited tungsten metallization pattern; nor the use of updiffusion from diffused substrate regions to form self-aligned contacts joining the tungsten metal layer to the diffused subtrate regions; nor the use of tungsten reduction of such conformally deposited intrinsic polysilicon or amorphous silicon to form self-aligned, low resistance, ohmic contacts; nor the combination of these contact and metallization techniques into a unitary contact and metallization process based solely upon the use of patterned silicon, irrespective of the impurity type of the joined regions, to define the interconnect, shunt and contact patterns.

Further examples of metallization techniques employing refractory metals or their silicides are described in U.S. Pat. No. 4,333,099 to inventors Tanguay et al.; U.S. Pat. No. 4,276,688 to inventor Hsu; U.S. Pat. NO. 4,330,931 to inventor Lui; and U.S. Pat. No. 4,374,700 to inventors Scott et al. The first two patents relate to the use of sputtered and patterned platinum and molybdenum refractory metals to form at correspondingly disposed silicon locations silicides which bridge p-n junctions or buried contacts for silicon on sapphire type CMOS structures. U.S. Pat. No. 4,330,931 describes the use of selectively deposited tungsten to plate regions of monocrystalline and polycrystalline silicon, and particularly on the gate, source and drain electrode regions of field effect transistors. According to the teaching in the fourth of the last noted U.S. Pat. No., 4,374,700 to Scott et al., silicides are used to bridge the gate oxide layers in a polysilicon interconnect structure. The silicide provides ohmic contact without regard to the impurity type of the interconnected regions.

Consider next the composite or multiple layer conductor approach for contacts formation and/or metallization. This technology includes a number of different structures, including for example polycide (a metal silicide over polycrystalline silicon) and the above-mentioned titanium-tungsten (Ti-W) over metal silicide layers. The multiple layer approach provides the opportunity to compensate for the undesirable characteristics of individual materials or compounds. For example, the composite structure of tungsten on polysilicon uses the tungsten to decrease the sheet resistance, while the underlying polysilicon provides the adhesion required to traverse dielectric materials such as silicon dioxide, which adhesion is not available from tungsten alone. However, typically, multiple layer prior art structures involve considerable processing complexity in sequentially forming and coextensively patterning the layers.

One such prior art approach, involving a composite silicon-nickel-lead contact system for bipolar integrated circuits, is disclosed in Denning, U.S. Pat. No. 3,632,436, issued Jan. 4, 1972. In a representative process sequence therefrom, a passivating layer is formed over the bipolar device wafer and is etched to provide emitter and base contact cuts. Then, a layer of silicon is blanket deposited onto both the insulator and the exposed substrate contact regions, and is thereafter masked and etched to provide the desired contact/conductor pattern. The nickel layer of the composite is selectively formed on the silicon base conductor by electroless plating, that is, by immersion in an electroless plating bath, followed by sintering to enhance the nickel adhesion to the silicon. Thereafter, the lead layer is formed on the nickel by dipping the structure in a molten lead solder bath. While the Denning patent discloses a composite contact system, the process is complicated in its use of electroless plating and molten solder baths. No shunting of differently doped simiconductor regions is taught or suggested. Furthermore, it seems doubtful whether the techniques are at all meaningful to current or future microelectronics processes.

Hall, U.S. Pat. No. 4,042,953, issued Aug. 16, 1977; U.S. Pat. No. 4,152,823, issued May 8, 1979; and U.S. Pat. No. 4,265,935, issued May 5, 1981, all relate to a refractory metal contact/interconnect fabrication techniques. Representative completed structures are comprised of a layer of high temperature inert refractory metal, such as molybdenum, tungsten, platinum, nickel or palladium, sandwiched between upper and lower silicon layers. In one application, the refractory metal sandwich composite is used to provide ohmic contact between a semiconductor substrate and a metal interconnect. In a second application, the composite forms MOSFET gate electrodes and interconnects.

For the contact application, the two silicon layers provide ohmic contact between the substrate and the refractory metal and between the refractory metal and the metal interconnect. A typical fabrication sequence involves forming a thick isolation oxide layer on the substrate and defining contact cuts therein, then sputter depositing the silicon and refractory metal, etching the metal to an interconnect pattern and thereafter sputter depositing the second silicon layer.

In the gate electrode/interconnect application, the refractory sandwich assembly is first blanket deposited layer by layer in a composite of silicon, refractory metal, and silicon over the gate oxide and field oxide, then is etched to the electrode/interconnect pattern desired. However, representative structures as depicted in FIGS. 3 and 4 of the Hall patents disclose arrangements in which the sandwiched gate electrode metallization is actually shorted to both the source and drain diffusions. More importantly in regard to the present invention, neither this second application nor the first suggests using a patterned layer of very thin conformally deposited intrinsic polysilicon or amorphous silicon to define the selectively deposited tungsten metallization pattern; nor the use of updiffusion from the substrate to form contacts; nor reduction of silicon by tungsten to form ohmic contacts; nor the combination of these contact and metallization techniques into a unitary contact and metallization process based solely upon the tungsten and silicon structure.

Still another three layer refractory metal composite is disclosed in Widmann, U.S. Pat. No. 4,356,622, issued Nov. 2, 1982. The Widmann three layer composite is a polysilicon, silicide, and oxide structure which performs three functions. First, the doped polysilicon layer serves as an impurity source for forming the source and drain regions. Secondly, the metal silicide intermediate layer decreases the sheet resistance of the underlying diffused source/drain regions. Thirdly, the oxide top layer prevents short circuits between the source/drain structure and the adjacent gate electrode.

Again, while the Widmann patent uses tungsten on silicon in the multiple purpose composite, there is no suggestion of using a patterned layer of very thin conformally deposited intrinsic polysilicon or amorphous silicon to define the selectively deposited tungsten metallization pattern; nor the use of updiffusion from the substrate to form contacts; nor reduction of silicon by tungsten to form ohmic contacts; nor the combination of these contact and metallization techniques into a unitary contact and metallization process based solely upon the tungsten and silicon structure.

Another approach to the use of tungsten in decreasing contact resistance, involving the prevention of silicide formation, is disclosed in Gargini et al., "WOS: Low Resistance Self-Aligned, Source, Drain and Gate Transistors", IEDM 1981, Paper 3.2, pp. 54–57. Using the Gargini et al. approach, the contact resistance to both silicon and polysilicon is decreased by the use of a selectively formed tungsten layer at the contact region. The gate oxide and the polysilicon gate electrode are defined in the active region and tungsten is selectively deposited to a thickness of about 150 nanometers on the doped gate electrode and the exposed doped substrate source/drain regions, preferably by chemical vapor deposition using $WF_6$ and $H_2$. A low temperature, plasma assisted chemical vapor deposition process is then used to form a silicon nitride interlayer dielectric for the aluminum metallization, following which contact cuts are formed and the metallization is applied. The use of silicon nitride avoids the typical use of a high temperature phosphorus doped oxide as the interlayer dielectric, and thereby avoids silicide formation with the underlying silicon at the temperatures normally used to reflow this oxide. In short, while the Gargini et al. approach does use the selective deposition of tungsten on silicon to decrease contact resistance to aluminum interconnects, there is no suggestion of using a patterned layer of very thin conformally deposited intrinsic polysilicon or amorphous silicon to define the selectively deposited tungsten metallization pattern; nor the use of updiffusion from the substrate to form contacts; nor reduction of silicon by tungsten to form ohmic contacts; nor the combination of these contact and metallization techniques into a unitary contact and metallization process based solely upon the tungsten and silicon structure.

The application of selectively deposited tungsten in combination with or distinct from aluminum to shunt polysilicon and monocrystalline silicon regions appears in U.S. Pat. No. 4,441,247 to inventors Gargini et al. However, as was true of the immediately preceding article, there appears no teaching of using a patterned layer of very thin conformally deposited intrinsic polysilicon or amorphous silicon to define the selectively deposited tungsten metallization pattern; nor the use of updiffusion from the substrate to form contacts; nor reduction of silicon by tungsten to form ohmic contacts; nor the combination of these contact and metallization techniques into a unitary contact and metallization process based solely upon the tungsten and silicon structure.

In view of the above discussion, it is one object of the present invention to provide a uniquely abridged process for forming a composite metallization layer comprising a thin layer of patterned intrinsic polysilicon or amorphous silicon together with a shunting tungsten layer.

Another object of the present invention is to provide a process for fabricating low resistance, self-aligned, ohmic contacts to substrate diffusion regions.

Still another object of the present invention is to provide a process for fabricating low resistance, self-aligned, ohmic contacts to substrate diffusion regions as part of a unitary process for forming integrated circuit metallization using a common composite structure and with a minimum number of additional processing operations.

It is also an object to provide a contact metallization process which is suitable for forming self-aligned, ohmic contacts to both n-type and p-type silicon, without preference or selectivity.

BRIEF SUMMARY

The above metallization objectives are provided in one aspect of the present invention by a process for forming self-aligned, low resistance tungsten on silicon interconnect metallization, and involves according to one practice depositing a thin, conformal layer of intrinsic polycrystalline or amorphous silicon on a partially fabricated substrate at low temperature, photolithographically patterning the silicon layer, and selectively forming by low pressure chemical vapor deposition (LPCVD) a layer of tungsten on all exposed monocrystalline, polycrystalline and amorphous silicon so as to provide a self-aligned, metallic, electrical shunt layer coextensive with the silicon.

The described process can be used for forming buried contacts between oppositely doped regions in the substrate, refractory metal lower level interconnects for highly nonplanar topography intermediate surfaces, connections between oppositely doped regions in a common polysilicon layer, and contacts between gate electrode level polysilicon and opposite impurity type diffusions in the substrate. In one form, the invention involves the conformal deposition of a thin, intrinsic polysilicon or amorphous silicon layer, a photolithographic patterning of the layer to define the metallization pattern, an anneal at low temperature to updiffuse dopant through the thin intrinsic silicon layer, and a selective deposition of tungsten onto exposed silicon of all forms, thereby providing low resistance, self-aligned, ohmic contacts between the tungsten layer and underlying regions of heavily doped silicon. In another form, the contacts result from the single or combined action of updiffusion and a partial or complete conversion of the thin intrinsic polysilicon or amorphous silicon to tungsten silicide when the tungsten is selectively deposited prior to the updiffusion anneal operation. A further variant involves the use of the tungsten layer to form a metallic bridge so as to electrically shunt any p-n junction between a gate electrode level polysilicon of one impurity type and an adjacent source/drain diffusion of the opposite impurity type.

According to another practice of the invention, doped polycrystalline silicon is deposited and patterned prior to the formation by implant, or the like, of the diffused source/drain interconnect regions. As so embodied, the diffused regions are subjected to some etching at the time the polycrystalline interconnect silicon is patterned at the contact with the diffused region. Thereafter, both the polysilicon and S/D regions are covered by selectively deposited tungsten, to provide an electrical shunt between the diffused region and the polysilicon interconnect without regard to the impurity types of the various regions.

In short, the present invention affords an operation-efficient process for forming low resistance tungsten on polysilicon or amorphous silicon metallization and/or low resistance, self-aligned, ohmic contacts and shunts for both p-type and n-type doped silicon.

DESCRIPTION OF THE DRAWINGS

The above and other aspects of the invention are described in conjunction with the attached drawings, in which:

FIGS. 1 through 4 are schematic cross-sections of an integrated circuit taken sequentially during the formation of lower level metallization and self-aligned contacts in accordance with the present invention.

DETAILED DESCRIPTION

Figures 1, 2:
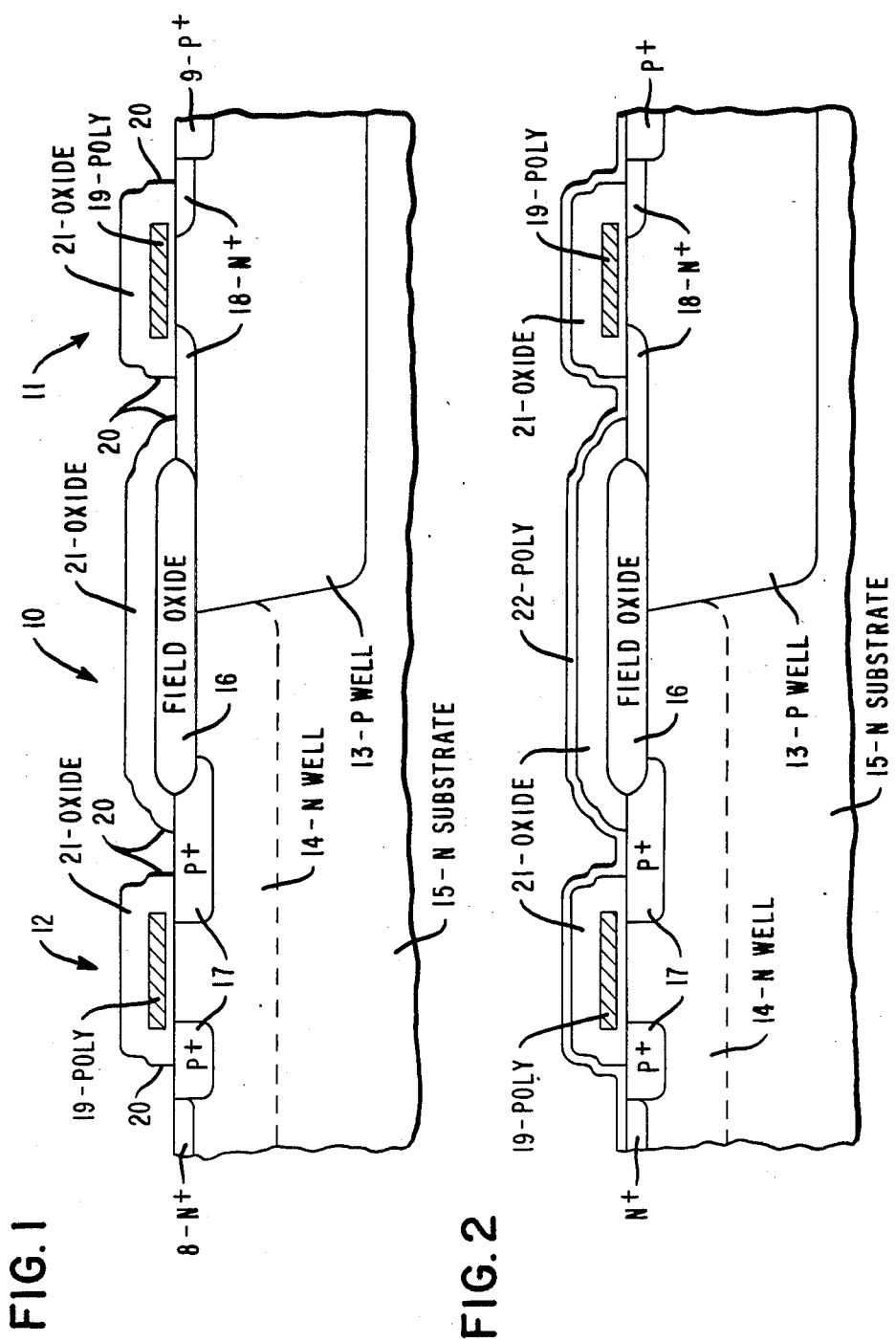

FIG. 1 is a cross-sectional representation of a CMOS type integrated circuit at an intermediate stage of fabrication, configured as an inverter. FIG. 1 depicts the CMOS integrated circuit structure 10 immediately after contact cuts have been made to the device source/drain regions. The structure 10 is the starting point for the application of the present invention. At this point, the integrated circuit structure 10 comprises an NMOS FET structure 11 and a PMOS FET structure 12 which are formed, respectively, in p-well 13 and n-well 14 of a <100> silicon substrate 15, with the active regions separated by a field isolation oxide 16. The NMOS FET 11 and PMOS FET 12 have source/drain regions 18 and 17, respectively, which are self-aligned with the polysilicon FET gate electrodes 19. Heavily doped well contact regions 8 and 9 immediately adjacent source and drain regions 17 and 18 provide ohmic connections to respective wells 14 and 13. As shown in the figure, the contact cuts 20—20 have been formed in the silicon dioxide interlevel dielectric layer 21. This can be done by any one of many conventional photolithographic masking and etching techniques. FIG. 1 quite obviously is only one, exemplary, application among the various NMOS, PMOS, CMOS, bipolar and other applications of the present contact and interconnect formation process.

Next, referring to FIG. 2, a layer of intrinsic polycrystalline or amorphous silicon 22, preferably about 50 nanometers or less in thickness, is conformally deposited on the IC structure of FIG. 1, typically using low pressure chemical vapor deposition (LPCVD) process. For instance, to deposit polysilicon one might use silane at 625°–675° C. temperature and 240 mTorr pressure. Optionally, silicon layer 22 is doped to a relatively low concentration with n-type impurity either during or after the deposition process using any of a number of standard technologies, e.g. by diffusion or ion implantation, to provide a concentration of about $1 \times 10^{20}$ atoms/cc. The deposited silicon layer provides excellent adhesion to the monocrystalline silicon of substrate 15 and field oxide 16, and being conformal also provides excellent step coverage.

Referring next to FIG. 3, where layer 22 is polysilicon, the layer is delineated by photoresist (PR) etch mask 23 and patterned by etching to define fine geometry contacts 24 and contact/interconnect 25. Polysilicon layer 22 (FIG. 2) is then patterned in the presence of mask 23 using, for example, an anisotropic reactive ion etch (RIE) to form very fine geometries of $\leq 2$ micrometers. A representative etch process is reactive ion etching using a fluorine based etching gas such as nitrogen trifluoride ($NF_3$). In reactive ion etching, the mechanical component or ion bombardment component dominates the chemical reaction component and provides very well defined, vertical geometries which are desirable in order to minimize lateral conductor dimensional variations.

A sinter operation, to updiffuse dopant from regions 8, 9, 17, and 18 through surface adjacent regions 24A and 25A, FIG. 4, of polysilicon layers 24 and 25, follows a strip of photoresist mask 23. A representative sinter operation would include an $N_2$ ambient conditioning at 800°–1000° C. for 10–60 minutes. In updiffusing, p-type and n-type dopants from the source/drain regions 17 and 18, and well contact regions 8 and 9, intrinsic polysilicon layers 24 and 25 are made conductive in surface adjacent regions 24A and 25A with corresponding dopant type.

Following the sinter or anneal operation used to updiffuse, a suitable preclean of the polysilicon outer surface, using, for example, $HNO_3$ at 85° C. for 10 minutes followed by 30:1 HF at 27° C. for 30 seconds, tungsten is selectively deposited, for example, to a thickness in the range of 250 to 500 nanometers. For instance, one may use a low pressure chemical vapor deposition (LPCVD) process, with representative conditions including the use of $WF_6 + H_2$ at a temperature of 300° C. and a pressure of 100 mTorr. This process deposits tungsten 26 and 27 over all the exposed silicon areas, in particular patterned polysilicon interconnect regions 24, 24A, 25 and 25A. This provides, as is evidenced in FIG. 4, self-aligned, ohmic, low resistance connections to the shunting layer of tungsten 26 and 27. The use of undoped silicon, together with dopant updiffusion during the sinter, permits the simultaneous formation of contacts to n-type and p-type regions such as 8, 9, 17 and 18. Any p-n junctions created within the updiffusion doped polysilicon or amorphous silicon layer region 24 and 25 are shorted by the immediately overlying tungsten layer. During this selective deposition step, no tungsten is formed over the oxide regions, such as the exposed interlevel dielectric 21. Because the tungsten deposits selectively on monocrystalline, polycrystalline or amorphous silicon, the tungsten pattern is defined by the shape of the exposed silicon, thereby providing automatically patterned, low resistance shunting regions 26 and 27 over the intrinsic and updiffusion doped regions of polysilicon, i.e., 24, 24A, 25 and 25A. Recall that such silicon exhibits excellent adhesion to the underlying oxide. Furthermore, tungsten is known to be highly resistant to electromigration, which feature becomes critical at small geometries. Note further, as shown in FIG. 4, that the selectively deposited tungsten occurs on the sidewall surfaces of the polysilicon as well as on the upper surface thereof, providing excellent conformal coverage of the polysilicon.

Preferably the sintering or annealing performed to updiffuse dopant through the intrinsic polycrystalline or amorphous silicon is performed prior to the selective deposition of tungsten. This avoids the temperature induced conversion of such silicon into tungsten silicide, which conversion is known to produce stresses as a result volumetric changes associated with such silicide formations.

Figure 5:
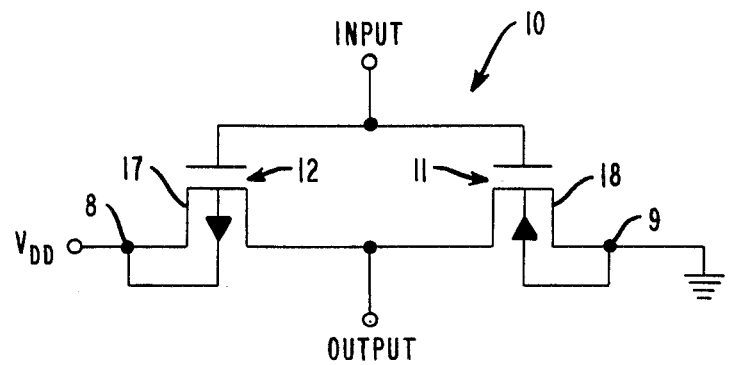
FIG. 5 is a schematic of the CMOS circuit formed by the structure depicted in FIG. 4.

The structural embodiment depicted in FIG. 4 is shown by way of electrical schematic in FIG. 5. Note that the use of selectively deposited tungsten has allowed a direct, buried contact type connection of the supply voltage $V_{DD}$ both to n-well 14 via n+ diffusion 8 and to p+ doped S/D diffusion 17 of p— channel FET 12, and further provides for a similar buried contact arrangement for the connection of electrical ground both to p+ diffusion 9 of p-well 13 and to S/D diffusion 18 of FET 11. As shown, the interconnect pattern for the two FET CMOS inverter 10 is formed by the composite of silicon layer 25 and tungsten layer 27, which interconnect has self-aligned contacts at S/D diffusions 17 and 18. Note that this interconnect corresponds to the output of the inverter depicted in FIG. 5.

In addition, if sufficiently thin layers of polysilicon or amorphous silicon 24 and 25 are used in the contact regions, the tungsten will, by complete reduction of the silicon, thereby make direct, self-aligned, ohmic, low resistance contacts, to the p-type and n-type source/drain and diffusion regions in the substrate. Furthermore, it is also possible to reduce the silicon to tungsten alone, whereby $2WF_6 + 3Si$ is reacted to form $2W + 3SiF_4$, with the latter being removed as a gas. Using the process parameters described above, the desired complete polysilicon reduction to tungsten and the resulting direct contact results from using a polysilicon thickness of 40 nanometers or less for the silicon layer regions 24 and 25 and a tungsten thickness of at least about 50 nanometers.

Following the above delineated contact formation, the integrated circuit structure 10 is completed conventionally by subjecting the substrate to passivation.

Thus, there has been described a process which uses selective tungsten deposition in a metallization scheme for VLSI devices. Either polycrystalline or amorphous silicon can be used as the base conductor layer for the selective tungsten deposition/patterning. When undoped silicon is used for the base layer, self-aligned, ohmic contacts can be formed simultaneously both in n-type and p-type silicon regions (such as source and drain diffusion regions) using a low temperature sinter operation. Alternatively, the sinter can be used to form self-aligned direct ohmic contacts to the source/drain regions or to other regions such as polysilicon gates by reduction of the very thin silicon layer to tungsten alone. The combined contact and contact/interconnect process forms contacts and metallization as a common structure.

A variation of the process in the present invention is depicted schematically in FIGS. 6A–6D, by cross-section at different stages of fabrication. The process differs in that the selectively deposited tungsten forms polysilicon to substrate diffusion contacts by tungsten bridging. It is particularly noteworthy that according to this practice of the invention neither the thickness nor the impurity type of the polysilicon or amorphous silicon patterned according to the interconnect layer affects the shunting value of the selectively deposited tungsten.

Figure 6A:
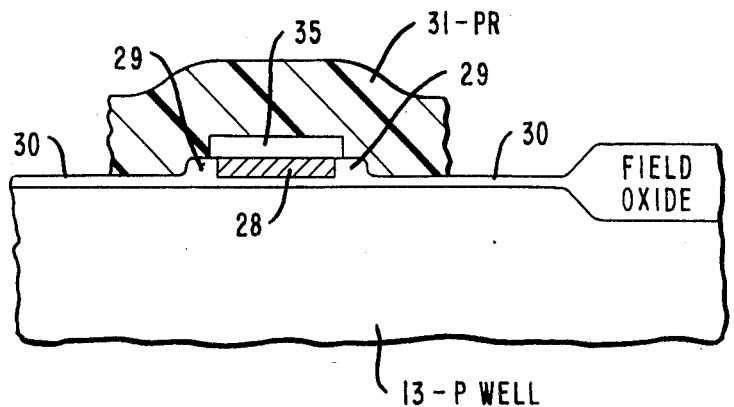
FIG. 6A–6D depict various stages in the fabrication of an alternate embodiment for making polysilicon to diffusion ohmic contacts, following a procedure in which the polysilicon layer is formed prior to the creation of the S/D or diffused interconnect regions in the substrate.

Beginning with FIG. 6A, there is shown a partially completed FET, having a gate electrode 28, an overlying silicon nitride layer 35, and relatively thick sidewall silicon dioxide regions 29. The active regions beyond sidewall oxides 29 are covered by thinner oxide layer 30. Preferably, according to the present practice of the invention, oxide layer 29 is thermally grown to extend approximately 100–150 nanometers laterally, while layer 30 is grown during the same operation to be in the range of 25-50 nanometers thick. Attention is directed to U.S. Pat. No. 4,503,601 by Chiao for related teaching.

The FET structure depicted in FIG. 6A includes the presence of patterned photoresist 31 preparatory to an etch of unmasked oxide 30, which etch selectively removes oxide 30 over the surface of the monocrystalline substrate, such as depicted p-well 13 in FIG. 6A.

Figure 6B:
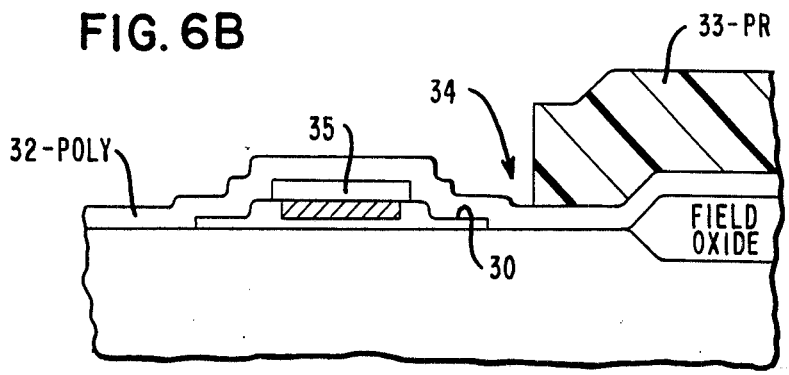

As shown in FIG. 6B, following the etch of exposed oxide 30, photoresist 31 is stripped, the wafer is conformally covered by an LPCVD layer of polysilicon 32, preferably to a thickness of approximately 10-50 nanometers, and in succession, masked by patterned photoresist 33. Note that at location 34 the pattern of photoresist 33 is spaced apart from the residuals of oxide layer 30. Because the impurity type of polysilicon layer 32 is of no consequence according to this practice of the invention, it may be in situ doped upon deposition, later doped by blanket implant, or doped in conjunction with the subsequent doping of the S/D regions.

Figure 6C:
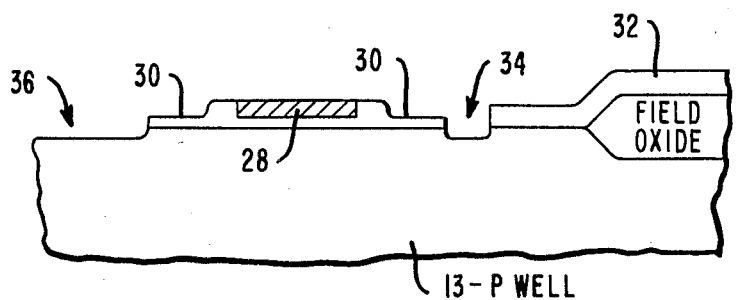

FIG. 6C depicts the shape of the structure after processing the configuration in FIG. 6B firstly with a silicon etchant, for which silicon dioxide and silicon nitride are etchant barriers, and then with a silicon nitride strip operation, both operations being commonly known and practiced. As is schematically depicted, the silicon etchant also removes a thin layer of p-well substrate 13 in exposed surface regions 34 and 36 by virtue of conventionally implemented overetching procedures.

Figure 6D:
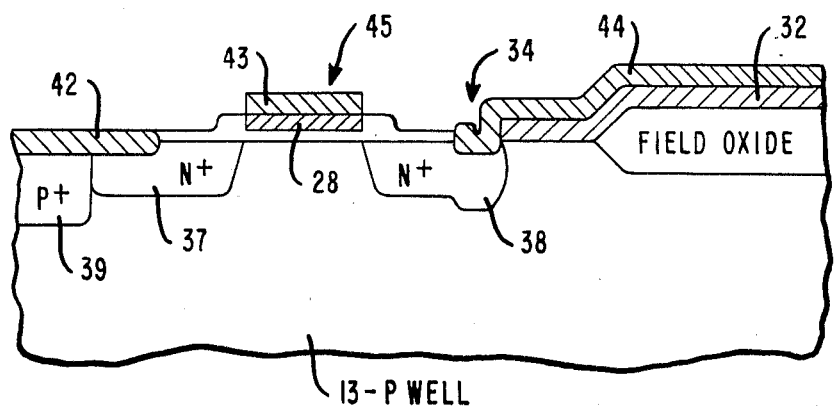

To reach the state of fabrication depicted in FIG. 6D, the structure in FIG. 6C is subjected to either diffusion or preferably implant operations to create source/drain regions 37 and 38, and by separate operation well contact diffusion 39. The need for individual masking and doping operations to create regions of different impurity type, such as 37 and 39, should be self-evident to those of skill in the art.

The electrical shunts by which such doped silicon regions of different impurity type are interconnected are again provided by selective deposited tungsten, layers 42, 43 and 44. As depicted in FIG. 6D, the FET at 45 now has S/D diffusion 37 connected to p-well contact diffusion 39, by way of a buried, low resistance, tungsten shunting layer 42, has polysilicon gate electrode 28 shunted by low resistant tungsten layer 43, and has interconnect polysilicon layer 32 making contact to S/D diffusion 38 by way of shunting tungsten layer 44. Tungsten layer 44 electrically bridges any p-n junction between diffusion 38 and polysilicon 32. Therefore, differences in the impurity type of diffusion 38 and polysilicon layer 32 have no consequence on the making of the contact. Furthermore, because updiffusion is not utilized according to this practice of the invention to make ohmic contact, the thickness of polysilicon 32 is also of no consequence.

Though the embodiment depicted in the fabrication sequence of FIGS. 6A-6D employs a capping nitride 35 to mask gate polysilicon 28 during the patterning of polysilicon contact/interconnect layer 32, it is equally feasible to use oxide alone, which oxide can be grown from polysilicon gate 28 or LPCVD deposited over the patterned polysilicon gate. In that case, an anisotropic etch of the oxide enclosing the FET gate electrode, so as to selectively retain sidewall oxide adjacent gate polysilicon 28, would supplant the nitride strip operation performed between FIGS. 6B and 6C of the drawings.

Having thus described preferred and alternative embodiments of the present invention, what is claimed is:

1. A process for forming a self-aligned, low resistance, ohmic, metal shunted contact and interconnect structure, comprising the steps of:
   providing a silicon substrate having doped surface regions;
   forming a layer of undoped silicon having a nominal thickness of 50 nanometers or less on the substrate over at least said selected doped surface regions;
   patterning the silicon to retain regions of the undoped silicon over the selected doped surface regions;
   sintering the structure at a lower temperature to updiffuse dopant from the silicon substrate regions into and through the silicon layer overlying the selected doped surface regions of the silicon substrate; and
   selectively depositing a layer of refractory metal on the silicon to form ohmic contacts between the doped surface regions and the immediately overlying metal layer through the selectively doped silicon.

2. The process recited in claim 1, wherein the step of forming a layer of undoped silicon is an LPCVD process in which the undoped silicon is conformally deposited.

3. The process recited in claim 2, wherein the undoped silicon is deposited in polycrystalline form and the metal is tungsten.

4. The process recited in claim 2, wherein the undoped silicon is deposited in amorphous form and the metal is tungsten.

5. The process recited in claim 3, wherein the sinter operation is performed at a temperature in the range of 800°-1000° C. and an inert atmosphere of $N_2$ at atmospheric pressure.

6. The process recited in claim 4, wherein the sinter operation is performed at a temperature in the range of 800°-1000° C. and an inert atmosphere of $N_2$ at atmospheric pressure.

7. A process for forming an aligned, low resistance, ohmic, tungsten shunted contact and interconnect structure, comprising the steps of:
   providing a silicon substrate with exposed regions for making buried contacts and exposed regions for making contacts between the silicon substrate and a silicon interconnect layer;
   forming a silicon interconnect layer on the silicon substrate to cover part of the exposed regions for making contacts between the silicon substrate and a silicon interconnect layer; and
   selectively depositing a layer of tungsten on exposed surfaces of the silicon substrate and the silicon interconnect layer to shunt any surface adjacent p-n junctions.

8. The process recited in claim 7, further including after the step of forming a silicon interconnect layer the step of:
   doping the source/drain and diffused interconnect regions of the silicon substrate.

9. The process recited in claim 8, wherein the step of forming a silicon interconnect layer is comprised of:
   forming a conformally deposited interconnect layer on the substrate; and
   patterning the conformally deposited interconnect layer in the presence of a mask to expose silicon substrate regions immediately adjacent the regions for making contacts.

10. The process recited in claim 9, wherein the silicon interconnect layer is of polycrystalline form and is conductively doped in conjunction with the doping of the source/drain and diffused interconnect regions.

* * * * *